(12) United States Patent
Kim et al.

(10) Patent No.: US 12,261,021 B2
(45) Date of Patent: Mar. 25, 2025

(54) APPARATUS AND METHOD FOR TREATING SUBSTRATE

(71) Applicant: Samsung Electronics Co., Ltd., Suwon-si (KR)

(72) Inventors: Hyun Bae Kim, Yongin-si (KR); Ji Hwan Kim, Hwaseong-si (KR); Hyong Seo Yoon, Suwon-si (KR); Sang Ki Nam, Seongnam-si (KR); Hyun Jae Lee, Seongnam-si (KR); Myung Geun Jeong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 527 days.

(21) Appl. No.: 17/719,680

(22) Filed: Apr. 13, 2022

(65) Prior Publication Data
US 2023/0072243 A1    Mar. 9, 2023

(30) Foreign Application Priority Data

Sep. 7, 2021   (KR) ........................ 10-2021-0118739

(51) Int. Cl.
*H01J 37/32* (2006.01)
(52) U.S. Cl.
CPC .. *H01J 37/32146* (2013.01); *H01J 37/32183* (2013.01); *H01J 37/32568* (2013.01); *H01J 37/3211* (2013.01); *H01J 2237/334* (2013.01)

(58) Field of Classification Search
CPC .......... H01J 37/32146; H01J 37/32183; H01J 37/32568; H01J 37/3211; H01J 2237/334
See application file for complete search history.

(56) References Cited

U.S. PATENT DOCUMENTS

| | | |
|---|---|---|
| 8,382,999 B2 | 2/2013 | Agarwal et al. |
| 9,460,894 B2 | 10/2016 | Lill et al. |
| 9,767,988 B2 | 9/2017 | Brouk et al. |
| 2016/0064194 A1 | 3/2016 | Tokashiki et al. |
| 2019/0035606 A1* | 1/2019 | Yoo ................. H01J 37/32146 |
| 2020/0227289 A1 | 7/2020 | Song et al. |
| 2020/0373124 A1 | 11/2020 | Yoon et al. |
| 2020/0411286 A1 | 12/2020 | Koshimizu et al. |

* cited by examiner

*Primary Examiner* — Henry Luong
(74) *Attorney, Agent, or Firm* — Harness, Dickey & Pierce, P.L.C.

(57) ABSTRACT

A substrate treatment apparatus including a chamber; a lower electrode in the chamber, wherein the substrate is on the lower electrode; an upper electrode in the chamber, and above the lower electrode; a pulse signal generator configured to generate a pulse signal; and a bias power supply configured to generate bias power having a pulsed non-sinusoidal waveform using the pulse signal, and supply the generated bias power to the lower electrode, wherein the bias power supply includes a DC power generator configured to receive the pulse signal and generate a direct-current (DC) voltage subjected to feedforward compensation based on the pulse signal; and a modulator configured to generate a power signal having a non-sinusoidal waveform using the DC voltage, and filter the power signal using the pulse signal to generate the bias power having the pulsed non-sinusoidal waveform.

17 Claims, 13 Drawing Sheets

APPARATUS AND METHOD FOR TREATING SUBSTRATE

CROSS-REFERENCE TO RELATED APPLICATION

This application claims priority from Korean Patent Application No. 10-2021-0118739 filed on Sep. 7, 2021 in the Korean Intellectual Property Office, and all the benefits accruing therefrom under 35 U.S.C. 119, the contents of which in its entirety are herein incorporated by reference.

BACKGROUND

Field

The present disclosure relates to apparatuses and methods for treating a substrate.

Description of Related Art

When manufacturing a semiconductor device or a display device, various processes such as etching, ashing, ion implantation, thin-film deposition, and cleaning are performed. Plasma may be used in these various processes.

To control ions activated by the plasma, a bias voltage is applied to an electrode in a process the chamber. The bias voltage induces a voltage on the substrate through a chuck. Controlling the voltage induced on the substrate may result in precisely controlling an ion energy incident on the substrate. Accordingly, a selectivity and/or an aspect ratio may be improved.

SUMMARY

A purpose of the present disclosure is to provide substrate treatment apparatuses having improved process characteristics.

Another purpose of the present disclosure is to provide substrate treatment methods having improved process characteristics.

Purposes according to the present disclosure are not limited to the above-mentioned purpose. Other purposes and advantages according to the present disclosure that are not mentioned may be understood based on following descriptions, and may be more clearly understood based on example embodiments according to the present disclosure. Further, it will be easily understood that the purposes and advantages according to the present disclosure may be realized using means shown in the claims and combinations thereof.

One aspect of the present disclosure provides a substrate treatment apparatus including a chamber; a lower electrode in the chamber, wherein the substrate is configured to be the lower electrode; an upper electrode in the chamber, and above the lower electrode; a pulse signal generator configured to generate a pulse signal; and a bias power supply configured to generate bias power having a pulsed non-sinusoidal waveform using the pulse signal, and supply the generated bias power to the lower electrode, wherein the bias power supply includes a DC power generator configured to receive the pulse signal and generate a direct-current (DC) voltage subjected to feedforward compensation based on the pulse signal; and a modulator configured to generate a power signal having a non-sinusoidal waveform using the DC voltage, and filter the power signal using the pulse signal to generate the bias power having the pulsed non-sinusoidal waveform.

Another aspect of the present disclosure provides an apparatus for treating a substrate, the apparatus including a DC voltage supply unit configured to generate a DC voltage, based on a feedforward compensation signal and a feedback compensation signal; a feedforward operator configured to receive a pulse signal and a feedforward signal, and generate the feedforward compensation signal based on the pulse signal and the feedforward signal; a feedback operator configured to receive a feedback signal as the DC voltage as fed back thereto and a command voltage, and to generate the feedback compensation signal based on a difference between the feedback signal and the command voltage; and a modulator configured to generate a power signal having a non-sinusoidal waveform using the DC voltage, and filter the power signal using the pulse signal to generate a bias power having a pulsed non-sinusoidal waveform.

Still another aspect of the present disclosure provides an apparatus for treating a substrate, the apparatus including a chamber; a lower electrode received in the chamber, wherein the substrate is seated on the lower electrode; an upper electrode received in the chamber, and disposed above the lower electrode; a pulse signal generator for generating a pulse signal; a bias power supply configured to generate bias power having a pulsed non-sinusoidal waveform using the pulse signal, and supply the generated bias power to the lower electrode; and a source power supply configured to generate source power having a pulsed high-frequency waveform using the pulse signal and supply the source power to the upper electrode, wherein the bias power supply includes a power switch configured to be turned on and off based on a pulse signal; a first operational (OP) amplifier configured to multiply a node voltage controlled by the power switch by a feedforward signal to generate a feedforward compensation signal; a second OP amplifier configured to generate a feedback compensation signal based on a difference between a feedback signal as a DC voltage fed back thereto and a command voltage; a third OP amplifier configured to generate a first control signal based on the feedforward compensation signal and the feedback compensation signal; a DC power control integrated circuit (IC) configured to generate a second control signal whose a duty ratio is controlled based on the first control signal; and a DC power main circuit configured to generate the DC voltage based on the second control signal.

Still another aspect of the present disclosure provides a method for treating a substrate, the method including loading the substrate onto a lower electrode in a chamber; generating a pulse signal in the chamber using source power; generating a DC voltage subjected to feedforward compensation based on the pulse signal; generating a power signal having a non-sinusoidal waveform using the DC voltage; filtering the power signal using the pulse signal to generate bias power having a pulsed non-sinusoidal waveform; and applying the bias power to the lower electrode.

The specific details of other example embodiments are included in the detailed descriptions and drawings.

BRIEF DESCRIPTION OF DRAWINGS

The above and other aspects and features of the present disclosure will become more apparent by describing in detail exemplary embodiments thereof with reference to the attached drawings, in which.

DETAILED DESCRIPTIONS

Figure 1:
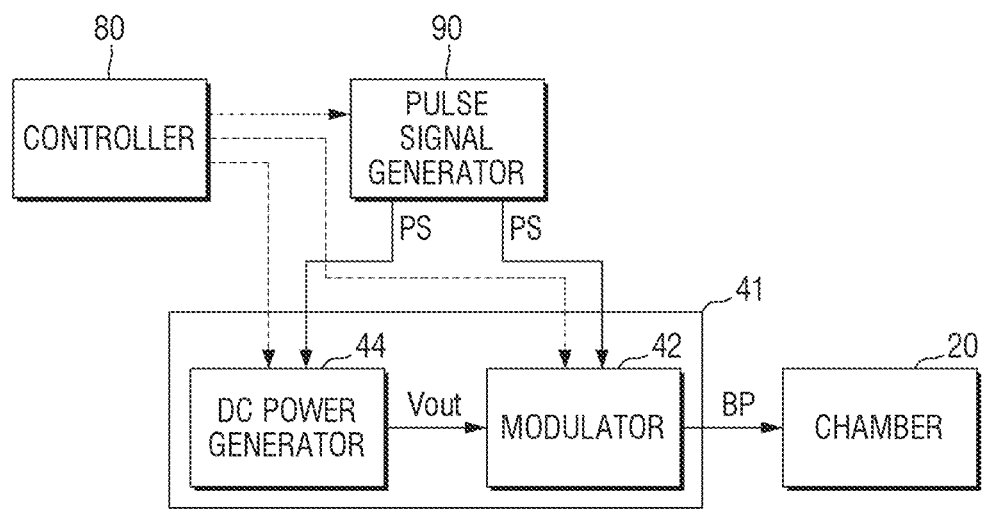
FIG. 1 is a block diagram for illustrating a substrate treatment apparatus according to some example embodiments of the present disclosure.

Hereinafter, some example embodiments of the present disclosure will be described in detail with reference to the accompanying drawings. The same reference numerals are used for the same components in the drawings, and duplicate descriptions thereof are omitted.

FIG. 1 is a block diagram for illustrating a substrate treatment apparatus according to some example embodiments of the present disclosure.

Referring to FIG. 1, the substrate treatment apparatus according to some example embodiments of the present disclosure includes a chamber 20, a bias power supply 41, a pulse signal generator 90, a controller 80, etc.

The chamber 20 has an inner space for a plasma process to be performed. The plasma process may include, for example, etching, ashing, ion implantation, thin-film deposition, cleaning, and the like. The disclosure is not limited thereto. The chamber 20 may be, for example, a cylindrical vacuum chamber. The chamber 20 may be made of a metal such as aluminum or stainless steel. However, the disclosure is not limited thereto. In the chamber 20, a support member, for example, a chuck is positioned. A substrate to be subjected to the plasma process treatment is seated on the support member.

The controller 80 controls the bias power supply 41, the pulse signal generator 90, etc.

The bias power supply 41 supplies bias power BP to the chamber 20 to control plasma ion energy. When the bias power BP is applied to an electrode adjacent to the support member, a voltage is induced in the substrate disposed on the electrode. Therefore, the voltage of the substrate is controlled according to the bias power BP, thereby controlling the ion energy of the plasma generated in the chamber 20.

In the substrate treatment apparatus according to some example embodiments of the present disclosure, the bias power BP has a pulsed non-sinusoidal waveform. That is, the bias power BP does not have a CW (continuous wave) waveform, but has a pulsed non-sinusoidal waveform having an on period and an off period. Therefore, the off period of the bias power BP may reduce problems such as ion charge-up, neutral saturation, and byproduct exhaust that may occur during a plasma process. Accordingly, a selectivity and/or aspect ratio may be improved.

The bias power supply 41 includes a DC power generator 44 and a modulator 42.

The DC power generator 44 generates DC voltage Vout for generating the bias power BP.

In particular, in the substrate treatment apparatus according to some example embodiments of the present disclosure, the DC power generator 44 receives a pulse signal PS from the pulse signal generator 90. The DC power generator 44 generates the DC voltage Vout subjected to feedforward compensation based on the pulse signal PS. A configuration and an operation of the DC power generator 44 will be described later in detail with reference to FIGS. 5 to 7.

The DC power generator 44 may generate and provide a plurality of DC voltages Vout. In some example embodiments, an example in which three DC voltages Vout, i.e., a first voltage (Vout1 in FIG. 2), a second voltage (Vout2 in FIG. 2), and a third voltage (Vout3 in FIG. 2) are provided to the modulator 42 will be described. The disclosure is not limited thereto. As used herein, when the first voltage/the second voltage/the third voltage should be distinguished from each other, Vout1, Vout2, and Vout3 are allocated thereto, respectively. Otherwise, the first voltage/the second voltage/the third voltage may be collectedly referred to as the DC voltage Vout.

The modulator 42 generates a power signal NS having a non-sinusoidal waveform under control of the controller 80 and using the plurality of DC voltages Vout1, Vout2, and Vout3 provided from the DC power generator 44, and then filters the power signal NS using the pulse signal PS provided from the pulse signal generator 90 to generate the bias power BP having the pulsed non-sinusoidal waveform. A configuration and an operation of the modulator 42 will be described later in detail with reference to FIGS. 2 to 4.

Figure 2:
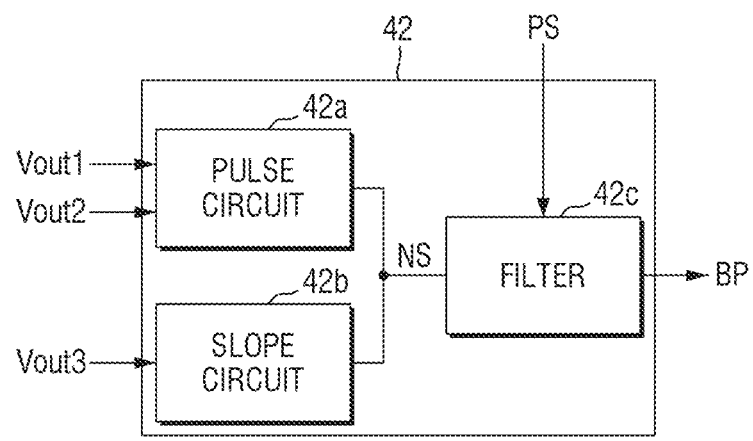
FIG. 2 is a block diagram for illustrating a modulator in FIG. 1.
Figure 3:
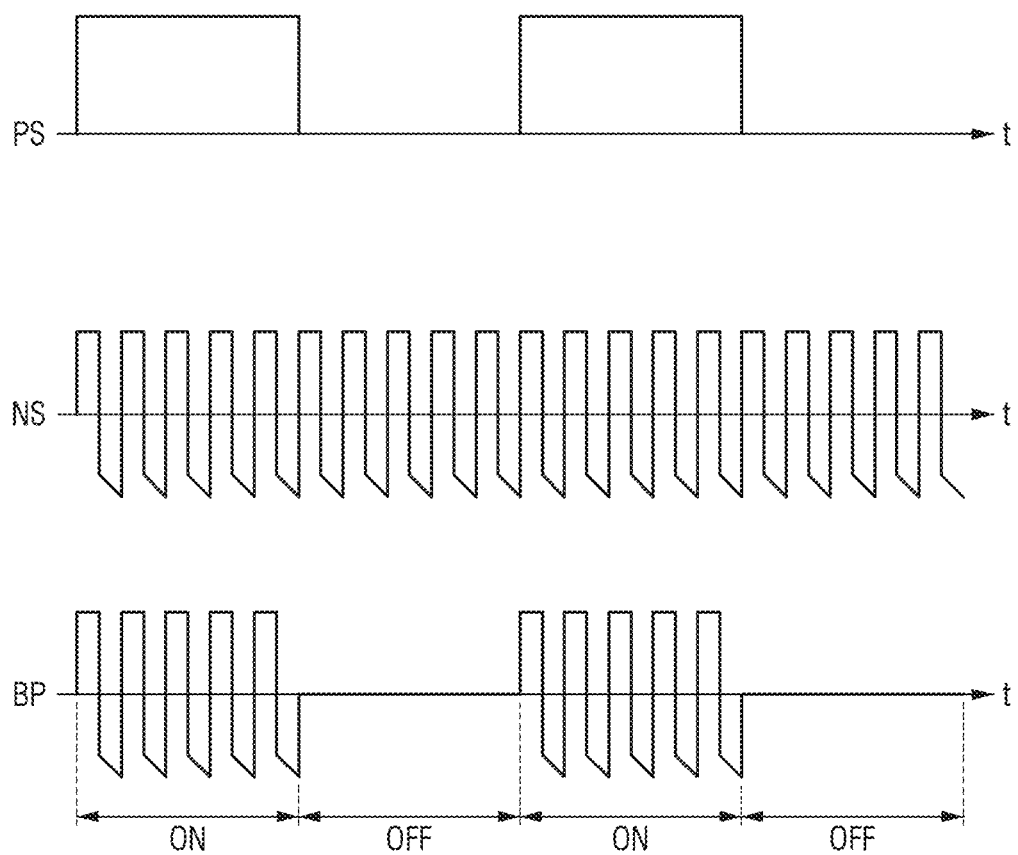
FIG. 3 is a diagram for illustrating an operation of the modulator in FIG. 1.
Figure 4:
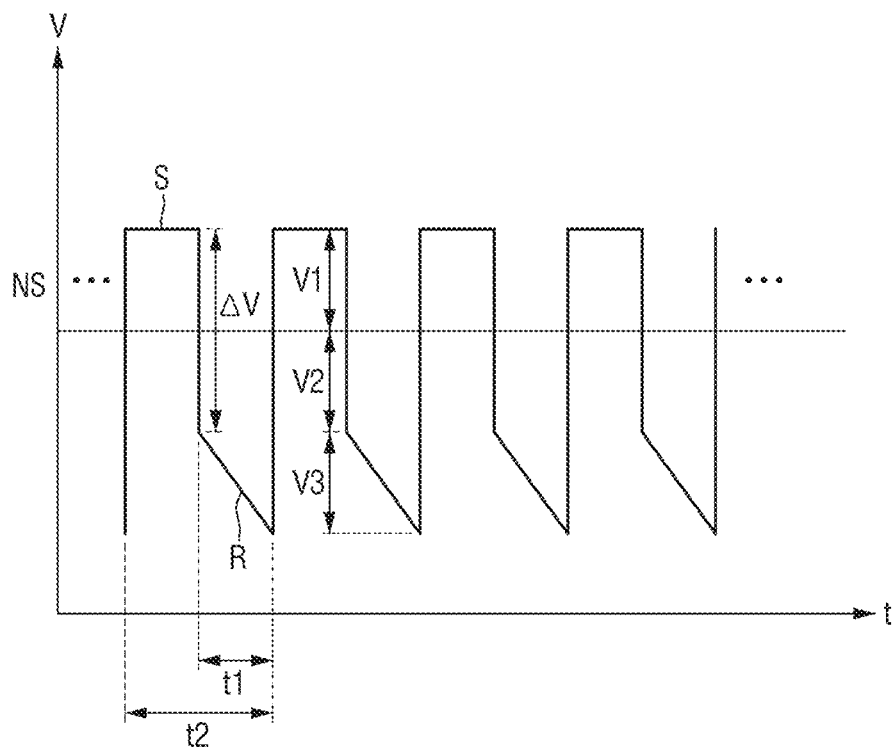
FIG. 4 is a diagram for illustrating a power signal having a non-sinusoidal waveform.

FIG. 2 is a block diagram for illustrating the modulator in FIG. 1, and FIG. 3 is a diagram for illustrating an operation of the modulator in FIG. 1. FIG. 4 is a diagram for illustrating a power signal having a non-sinusoidal waveform.

Referring to FIG. 2 to FIG. 4, the modulator 42 may include a pulse circuit 42a, a slope circuit 42b, and a filter 42c.

The pulse circuit 42a and the slope circuit 42b are connected to each other in a parallel manner. Under control of the controller 80, the pulse circuit 42a and the slope circuit 42b generate the power signal NS having the non-sinusoidal waveform through a common output.

Specifically, the pulse circuit 42a receives the first voltage Vout1 and the second voltage Vout2 from the DC power generator 44. The slope circuit 42b receives the third voltage Vout3 from the DC power generator 44.

As shown in FIG. 4, the power signal NS has a DC pulse region S and a ramp region R in one period. The ramp region R is present between adjacent DC pulse regions S. The ramp region R is generated by the slope circuit 42b modulating a portion of the pulse region. The ramp region R may have a waveform in which a voltage gently decreases over time, that is, having a negative slope.

The pulse circuit 42a and the slope circuit 42b may control a positive voltage value V1 of the DC pulse region S, a negative voltage value V2 of the DC pulse region S, a voltage value V3 of the ramp region R, a slope dV/dt of the ramp region R, an application time percentage t1/t2 of the ramp region R, and an on/off duty ratio of the non-sinusoidal waveform under the control of the controller 80.

For example, a frequency of the DC pulse region S may be adjusted in a range of about or exactly 100 kHz to about or exactly 400 kHz. The positive voltage value V1 of the DC pulse region S may be adjusted in a range of about or exactly 0V to about or exactly 600V. The negative voltage value V2 of the DC pulse region S may be adjusted in a range of about or exactly 0V to about or exactly −700V. The voltage value V3 of the ramp region R may be adjusted in a range of about or exactly −100V to about or exactly −600V. The application time percentage t1/t2 of the ramp region R in one period may be adjusted in a range of about or exactly 20% to about or exactly 80%. An on/off frequency of the non-sinusoidal waveform in a process period may be adjusted in a range of about or exactly 10 Hz to about or exactly 1000 Hz. The on/off duty ratio of the non-sinusoidal waveform in the process period may be adjusted in a range of about or exactly 5% to about or exactly 95%.

The filter 42c filters the power signal NS using the pulse signal PS to generate the bias power BP having the pulsed non-sinusoidal waveform. For example, the bias power BP may be generated in which the power signal NS is transmitted when the pulse signal PS is at a high level H, and the power signal NS is not transmitted when the pulse signal PS is at a low level L. However, the disclosure is not limited thereto.

As shown in FIG. 3, the bias power BP has an on period ON and an off period OFF.

For the ON period of the bias power BP, the voltage of the substrate may be controlled. Accordingly, the ion energy of the plasma generated in the chamber 20 may be controlled.

The OFF period of the bias power BP may reduce the problems of ion charge-up, neutral saturation, and byproduct exhaust that may occur during the plasma process.

Figure 5:
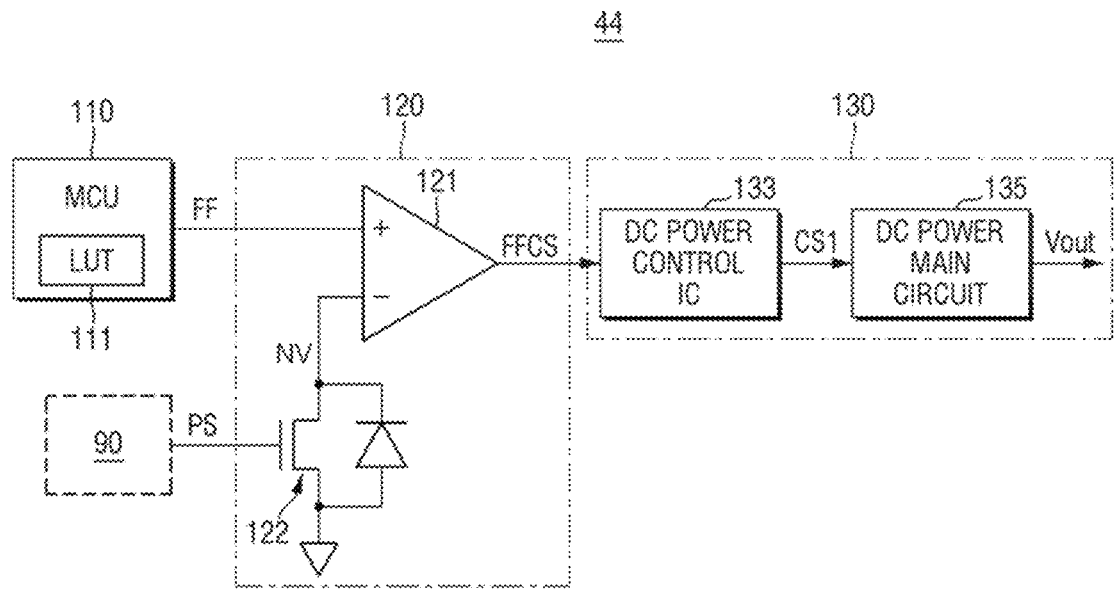
FIG. 5 is a block diagram for illustrating a DC power generator of FIG. 1.

FIG. 5 is a block diagram for illustrating the DC power generator of FIG. 1.

Referring to FIG. 5, the DC power generator 44 includes a sub-controller 110, a feedforward operator 120, a DC voltage supply unit 130.

The sub-controller 110 may control the feedforward operator 120 and the DC voltage supply unit 130 under the control of the controller 80.

In particular, the sub-controller 110 generates a feedforward signal FF corresponding to a command voltage VCOMMAND.

In this connection, the command voltage VCOMMAND refers to a signal generated by the sub-controller 110 and indicates a target, or desired, voltage level of the DC voltage Vout. The target, or desired, voltage level may be received in real time from the controller 80 or may be preset at booting time. The target, or desired, voltage level may be modified during an operation of the substrate treatment apparatus.

In one example, the feedforward signal FF refers to a signal indicating a feedforward compensation amount. A required feedforward compensation amount may be preset based on levels of various command voltages VCOMMAND, via a test. The feedforward compensation amount is stored, in a format of a lookup table LUT 111, in the sub-controller 110. That is, the lookup table 111 stores therein a feedforward compensation amount corresponding to each of the plurality of command voltages VCOMMAND. In other words, the sub-controller 110 may be configured to store the feedforward compensation amount in a lookup table LUT 111. The feedforward compensation amount is a digital value (as in a discrete or finite number, such as, an integer or a string of binary digits, however the disclosure is not limited thereto). The feedforward compensation amount is converted to the feedforward signal FF as an analog signal (which may be a continuous signal) by a digital to analog converter.

The feedforward operator 120 may include a power switch 122 and a first OP amplifier 121. The power switch 122 is turned on and off based on the pulse signal PS provided from the pulse signal generator 90. The first OP amplifier 121 may multiply a node voltage NV controlled by the power switch 122 by the feedforward signal FF to generate a feedforward compensation signal FFCS. That is, the feedforward compensation signal FFCS refers to a signal to allow the feedforward compensation when the pulse signal PS is at a first level and to disallow the feedforward compensation when the pulse signal PS is at a second level.

The DC voltage supply unit 130 receives the feedforward compensation signal FFCS and generates the DC voltage Vout corresponding to the command voltage VCOMMAND.

The DC voltage supply unit 130 includes a DC power control IC 133 and a DC power main circuit 135. The DC power control IC 133 generates a control signal CS1 whose a duty ratio is controlled based on the feedforward compensation signal FFCS. The DC power main circuit 135 generates the DC voltage Vout based on the control signal CS1.

Hereinafter, a reason why the feedforward compensation is performed when generating the DC voltage Vout is described.

As described above, when the bias power BP having the pulsed non-sinusoidal waveform is used, the bias power BP has the on period ON and the off period OFF. That is, in an output waveform of the bias power BP, the on/off periods are alternated with each other based on the pulse signal PS. However, overshoot of the bias power BP may occur in a transient period. To the contrary, as in the substrate treatment apparatus according to some example embodiments of the present disclosure, when using the DC voltage Vout subjected to the feedforward compensation using the pulse signal PS, the overshoot of the bias power BP is reduced in the transient period, and a setting time is reduced.

Further, as described above, the DC power generator 44 may be implemented as a digital/analog hybrid circuit. This is because the feedforward compensation amount may be provided in a digital form (as in a discrete or finite number, such as, an integer or a string of binary digits, however the disclosure is not limited thereto), and a remaining circuit that performs the feedforward compensation based on the feedforward compensation amount may be implemented as an analog circuit. Such a circuit may be implemented as an FPGA (field programmable gate array) including a designable logic element and a programmable internal circuit.

Figure 6:
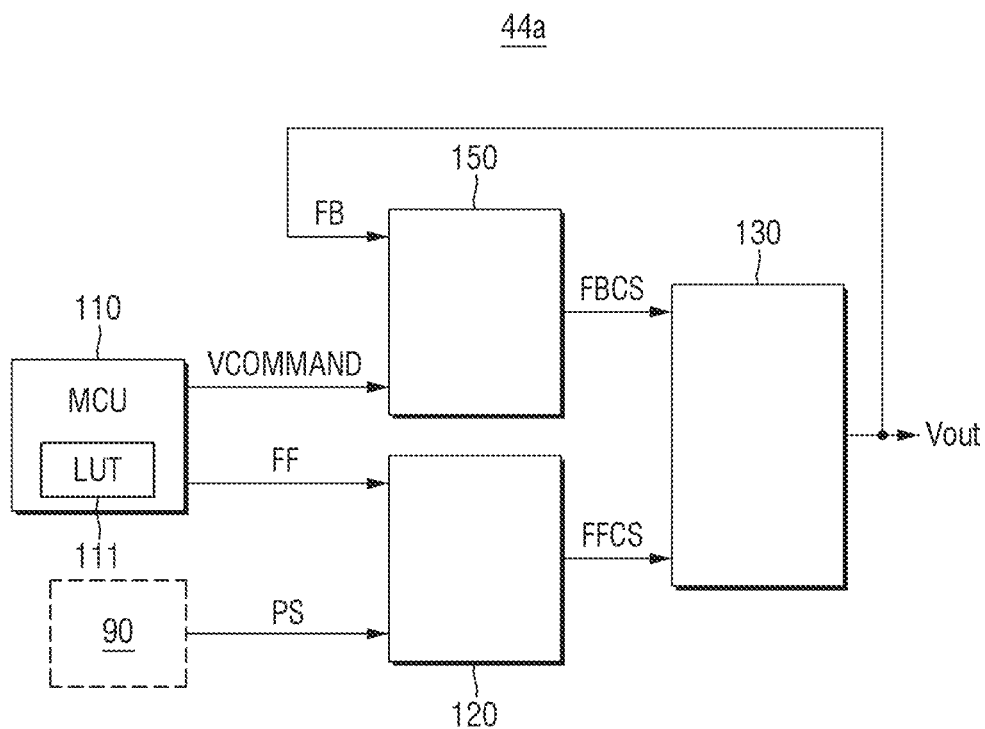
FIG. 6 is a block diagram for illustrating a DC power generator used in a substrate treatment apparatus according to some example embodiments of the present disclosure.
Figure 7:
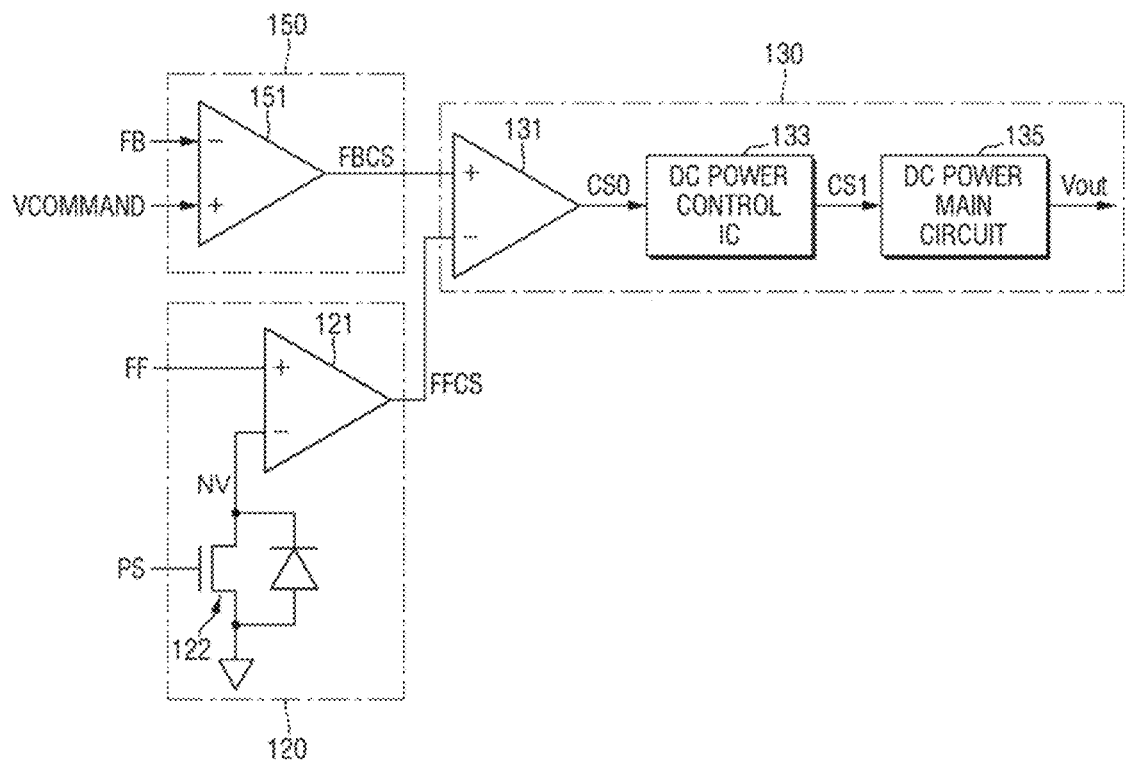
FIG. 7 is a circuit diagram for illustrating each block in FIG. 6.

FIG. 6 is a block diagram for illustrating a DC power generator used in a substrate treatment apparatus according to some example embodiments of the present disclosure. FIG. 7 is a circuit diagram for illustrating each block in FIG.

6. For convenience of description, following descriptions are mainly based on differences from the descriptions with reference to FIGS. 1 to 5.

Referring to FIG. 6 and FIG. 7, a DC voltage Vout used in the substrate treatment apparatus according to some example embodiments of the present disclosure has been subjected to feedforward compensation as well as feedback compensation.

To this end, a DC power generator 44*a* includes a feedback operator 150 in addition to the sub-controller 110, the feedforward operator 120, and the DC voltage supply unit 130.

The sub-controller 110 may control the feedforward operator 120, the feedback operator 150, the DC voltage supply unit 130, etc. under the control of the controller 80.

The sub-controller 110 provides the command voltage VCOMMAND to the feedback operator 150 and provides the feedforward signal FF to the feedforward operator 120.

The feedforward operator 120 receives the feedforward signal FF indicating the feedforward compensation amount and the pulse signal PS and generates the feedforward compensation signal FFCS. The feedforward operator 120 includes the power switch 122 and the first OP amplifier 121. The power switch 122 is turned on and off based on the pulse signal PS provided from the pulse signal generator 90. The first OP amplifier 121 may multiply the node voltage NV controlled by the power switch 122 by the feedforward signal FF to generate the feedforward compensation signal FFCS. The node voltage NV is input to a (−) terminal of the first OP amplifier 121, while the feedforward signal FF is input to a (+) terminal thereof. That is, the feedforward compensation signal FFCS refers to a signal to allow the feedforward compensation when the pulse signal PS is at the first level and to disallow the feedforward compensation when the pulse signal PS is at the second level.

The feedback operator 150 receives a feedback signal FB as the DC voltage Vout fed back thereto, and the command voltage VCOMMAND, and generates a feedback compensation signal FBCS based on a difference between the feedback signal FB and the command voltage VCOMMAND.

The feedback operator 150 includes a second OP amplifier 151 which generates the feedback compensation signal FBCS based on the difference between the feedback signal FB and the command voltage VCOMMAND. The feedback signal FB is input to a (−) terminal of the second OP amplifier 151, and the command voltage VCOMMAND is input to a (+) terminal thereof.

The DC voltage supply unit 130 receives the feedforward compensation signal FFCS and the feedback compensation signal FBCS, and generates the DC voltage Vout corresponding to the command voltage VCOMMAND.

The DC voltage supply unit 130 includes a third OP amplifier 131, a DC power control IC 133 and a DC power main circuit 135.

The third OP amplifier 131 generates a first control signal CS0 based on the feedforward compensation signal FFCS and the feedback compensation signal FBCS. The feedforward compensation signal FFCS is input to a (−) terminal of the third OP amplifier 131, and the feedback compensation signal FBCS is input to a (+) terminal thereof. The third OP amplifier 131 sums the feedforward compensation signal FFCS and the feedback compensation signal FBCS to generate the first control signal CS0. Therefore, both the feedforward compensation and the feedback compensation are performed when the pulse signal PS is at a first level, while only the feedback compensation is performed when the pulse signal PS is at a second level.

The DC power control IC 133 generates a second control signal CS1 whose a duty ratio is controlled based on the first control signal CS0. The DC power main circuit 135 generates the DC voltage Vout based on the second control signal CS1.

Figure 8:
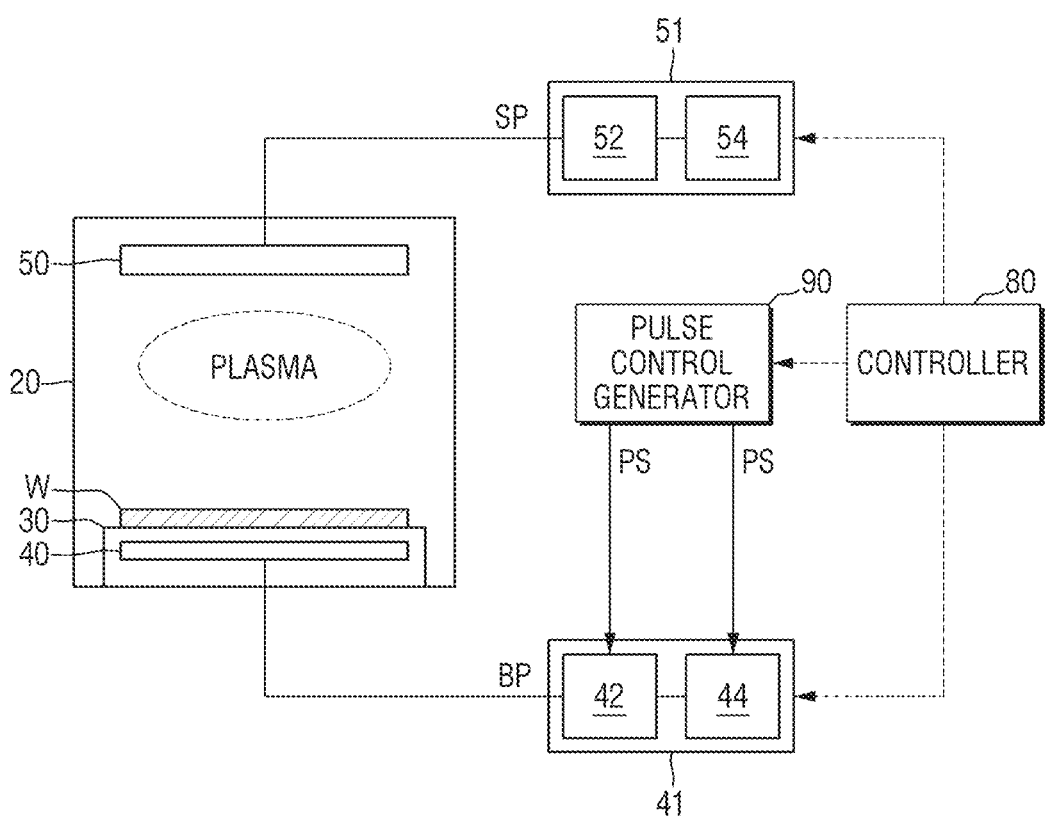
FIG. 8 is a block diagram for illustrating a substrate treatment apparatus according to some example embodiments of the present disclosure.
Figure 9:
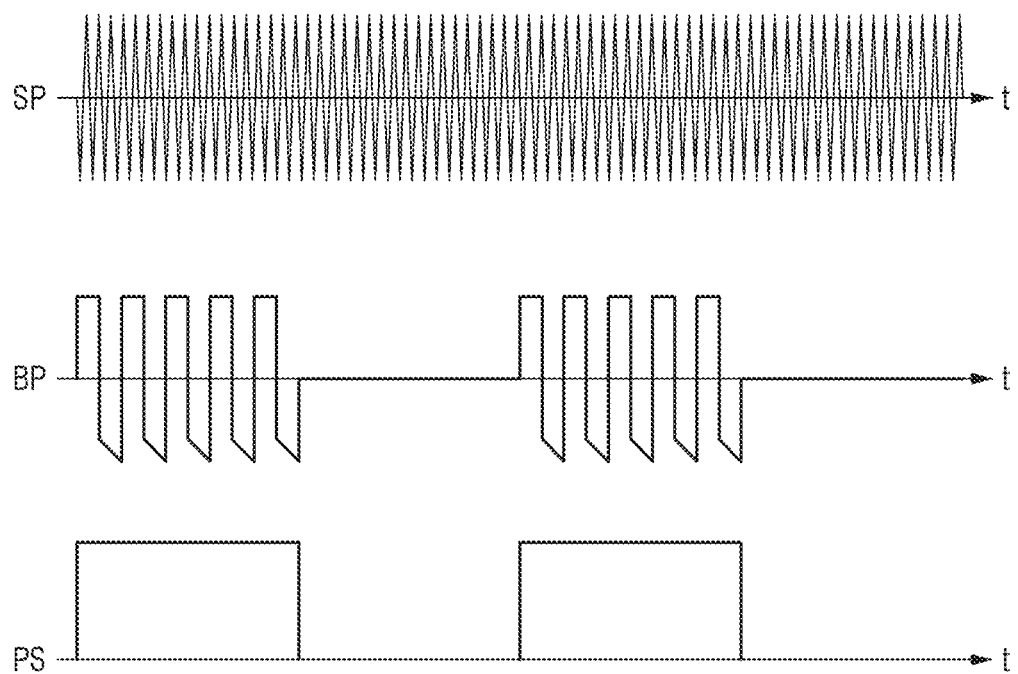
FIG. 9 is a diagram for illustrating examples of a pulse signal, a bias power, and a source power used in the substrate treatment apparatus of FIG. 8.

FIG. 8 is a block diagram for illustrating a substrate treatment apparatus according to some example embodiments of the present disclosure. FIG. 9 is a diagram for illustrating a pulse signal, a bias power and a source power used in the substrate treatment apparatus of FIG. 8. For convenience of description, contents substantially the same as the contents as described above using FIGS. 1 to 7 will be omitted below.

Referring to FIG. 8 and FIG. 9, in the substrate treatment apparatus according to some example embodiments of the present disclosure, the bias power BP may have a pulsed non-sinusoidal waveform, and the source power SP may have a CW (Continuous Wave) waveform.

Specifically, the substrate treatment apparatus according to some example embodiments of the present disclosure includes the chamber 20, the bias power supply 41, a source power supply 51, the pulse signal generator 90, the controller 80, etc.

The chamber 20 may receive therein an upper electrode 50, a lower electrode 40 and a support member 30. The support member 30 serves as a susceptor to support a substrate W thereon. For example, the support member 30 may be embodied as an electrostatic chuck for holding the substrate W on a top face of the support member 30 using an electrostatic attraction force. The lower electrode 40 may be disposed in the support member 30, and the upper electrode 50 may be disposed above the support member 30. The lower electrode 40 is connected to the bias power supply 41, while the upper electrode 50 is connected to the source power supply 51.

The pulse signal generator 90 generates the pulse signal PS. The pulse signal PS is provided to the bias power supply 41 and is not provided to the source power supply 51.

As described above, the bias power supply 41 generates the bias power BP having the pulsed non-sinusoidal waveform using the pulse signal PS, and provides the bias power BP to the lower electrode 40.

Specifically, the bias power supply 41 includes the DC power generator 44 and the modulator 42. Each of the DC power generator 44 and the modulator 42 receives the pulse signal PS. The DC power generator 44 generates the DC voltage subjected to feedforward compensation and/or feedback compensation based on the pulse signal PS. The modulator 42 generates the power signal NS having the non-sinusoidal waveform using the DC voltage, and filters the power signal NS using the pulse signal PS to generate the bias power BP having the pulsed non-sinusoidal waveform.

The source power supply 51 includes a high-frequency signal generator 54 that generates the source power SP having a high-frequency waveform, and a matcher 52 that matches an impedance of the generated source power SP.

As shown in FIG. 9, the source power supply 51 generates the source power SP and provides the source power to the upper electrode 50. A frequency of the source power SP may be, for example, in a range of several MHz to several tens of MHz, or about or exactly 3 MHz to about or exactly 90 MHz. In one example, the source power SP may be 13.56 MHz.

The pulse signal generator 90 generates the pulse signal PS. A frequency of the pulse signal PS may be, for example, in a range of several Hz to several tens of kHz.

The bias power supply 41 generates the power signal NS having the non-sinusoidal waveform. A frequency of the power signal NS may be several hundred kHz, for example, 400 kHz. Further, the bias power supply 41 filters the power signal NS using the pulse signal PS to generate the bias power BP having the pulsed non-sinusoidal waveform.

Figure 10:
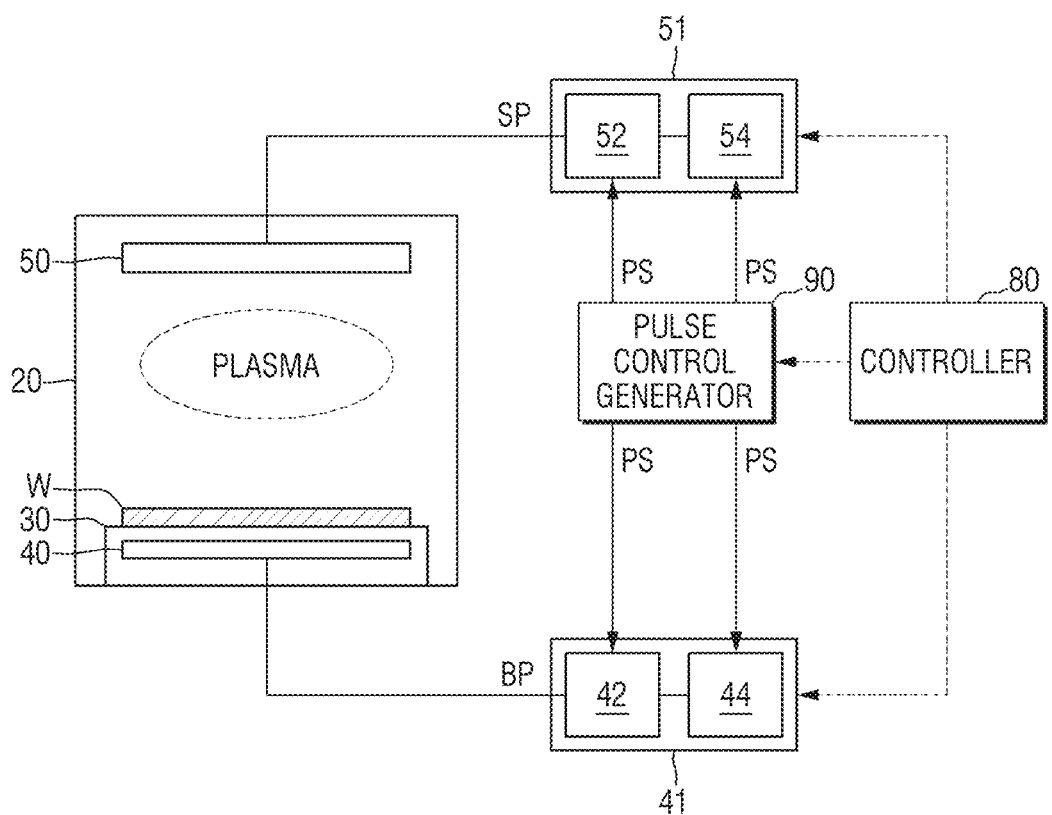
FIG. 10 is a block diagram for illustrating a substrate treatment apparatus according to some example embodiments of the present disclosure.
Figure 11:
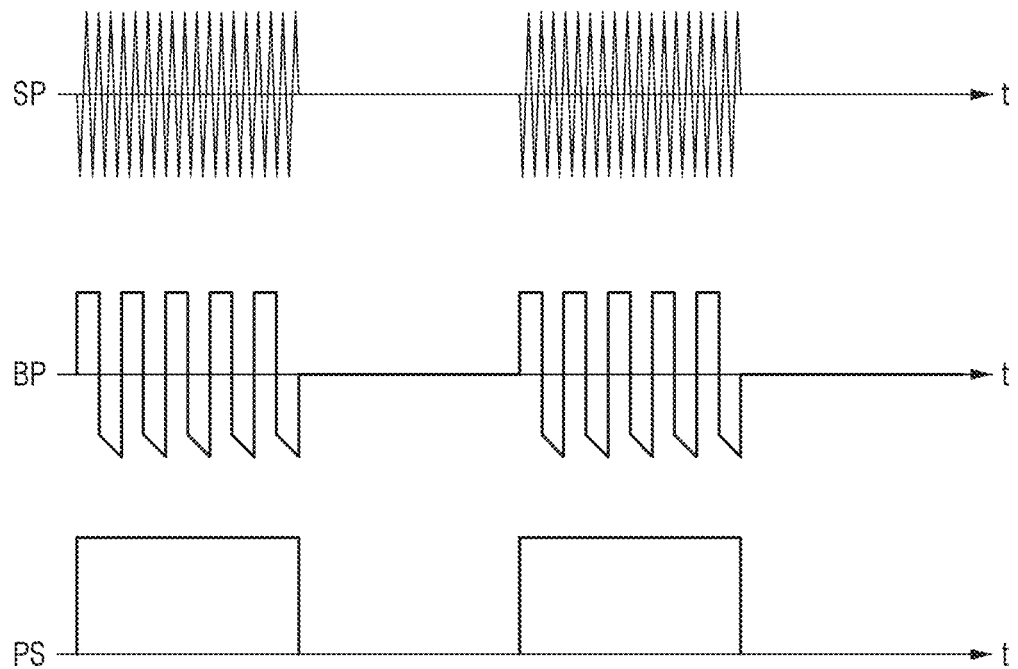
FIG. 11 is a diagram for illustrating examples of a pulse signal, a bias power, and a source power used in the substrate treatment apparatus of FIG. 10.
Figure 12:
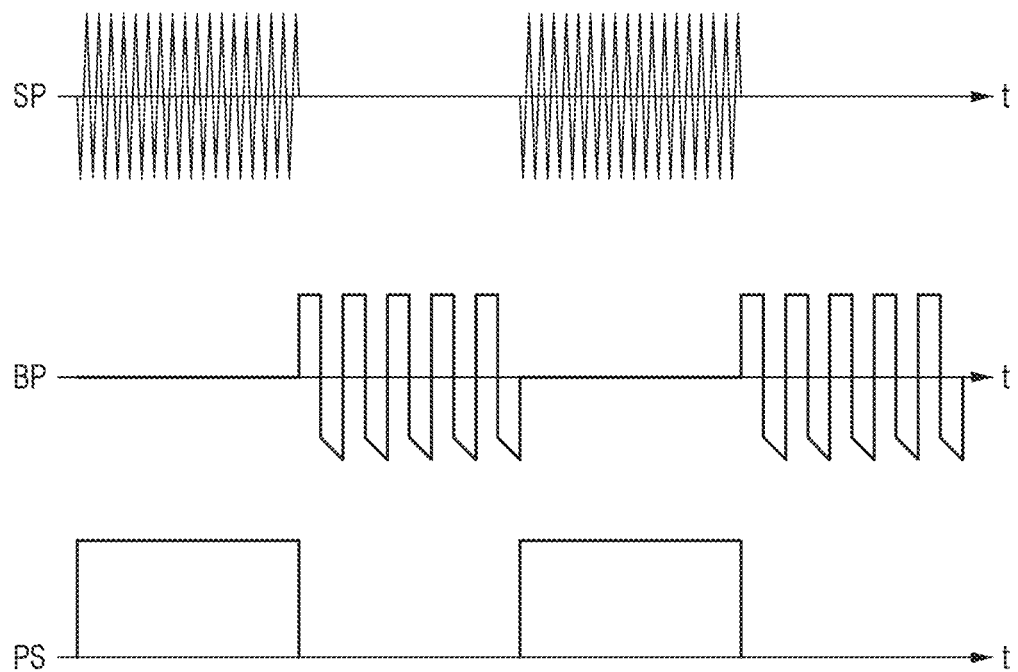
FIG. 12 is a diagram for illustrating another examples of a pulse signal, a bias power and a source power used in the substrate treatment apparatus of FIG. 10.

FIG. 10 is a block diagram for illustrating a substrate treatment apparatus according to some example embodiments of the present disclosure. FIG. 11 is a diagram for illustrating an example of a pulse signal, a bias power, and a source power used in the substrate treatment apparatus of FIG. 10. FIG. 12 is a diagram for illustrating another example of the pulse signal, the bias power and the source power used in the substrate treatment apparatus of FIG. 10.

Referring to FIG. 10, in the substrate treatment apparatus according to some example embodiments of the present disclosure, the bias power BP has a pulsed non-sinusoidal waveform, and the source power SP has a pulsed high-frequency waveform.

Specifically, the substrate treatment apparatus according to some example embodiments of the present disclosure includes the chamber 20, the bias power supply 41, the source power supply 51, the pulse signal generator 90, the controller 80, etc.

The pulse signal generator 90 generates the pulse signal PS.

The pulse signal PS is provided to the source power supply 51 as well as the bias power supply 41. That is, the pulse signal PS is provided to the high-frequency signal generator 54 of the source power supply 51.

The high-frequency signal generator 54 generates the source power SP having the pulsed high-frequency waveform using the pulse signal PS.

The pulse signal PS is optionally provided to the matcher 52 of the source power supply 51. A capacitance position (e.g., a capacitance value) in the matcher 52 may be controlled based on the pulse signal PS. The matcher 52 matches an impedance of the source power SP provided from the high-frequency signal generator 54 and provides the source power subjected to the impedance matching to the upper electrode 50.

The bias power supply 41 generates the bias power BP having the pulsed non-sinusoidal waveform as described above. As shown in FIG. 11, the bias power BP may be synchronized to the pulse signal PS. As shown in FIG. 12, the bias power BP may be shifted relative to the source power SP.

Figure 13:
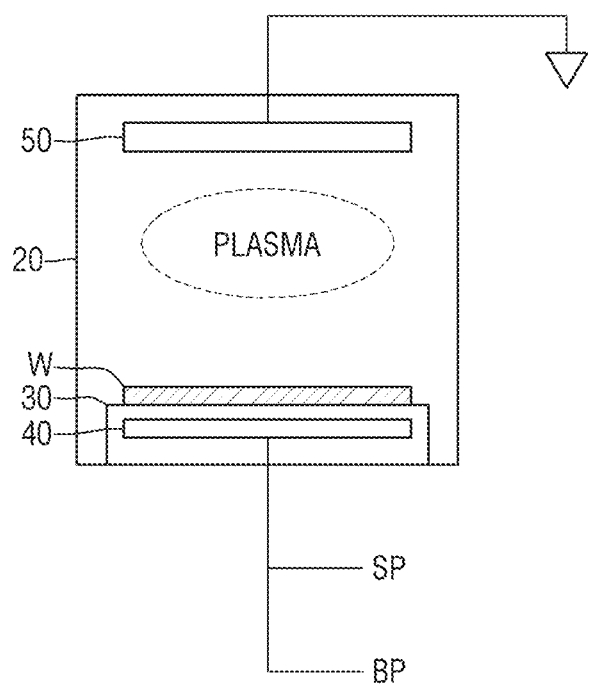
FIG. 13 is a block diagram for illustrating a substrate treatment apparatus according to some example embodiments of the present disclosure.

FIG. 13 is a block diagram for illustrating a substrate treatment apparatus according to some example embodiments of the present disclosure. Referring to FIG. 13, in the substrate treatment apparatus according to some example embodiments of the present disclosure, the upper electrode 50 may be grounded, and both the source power SP and the bias power BP may be supplied to the lower electrode 40.

Figure 14:
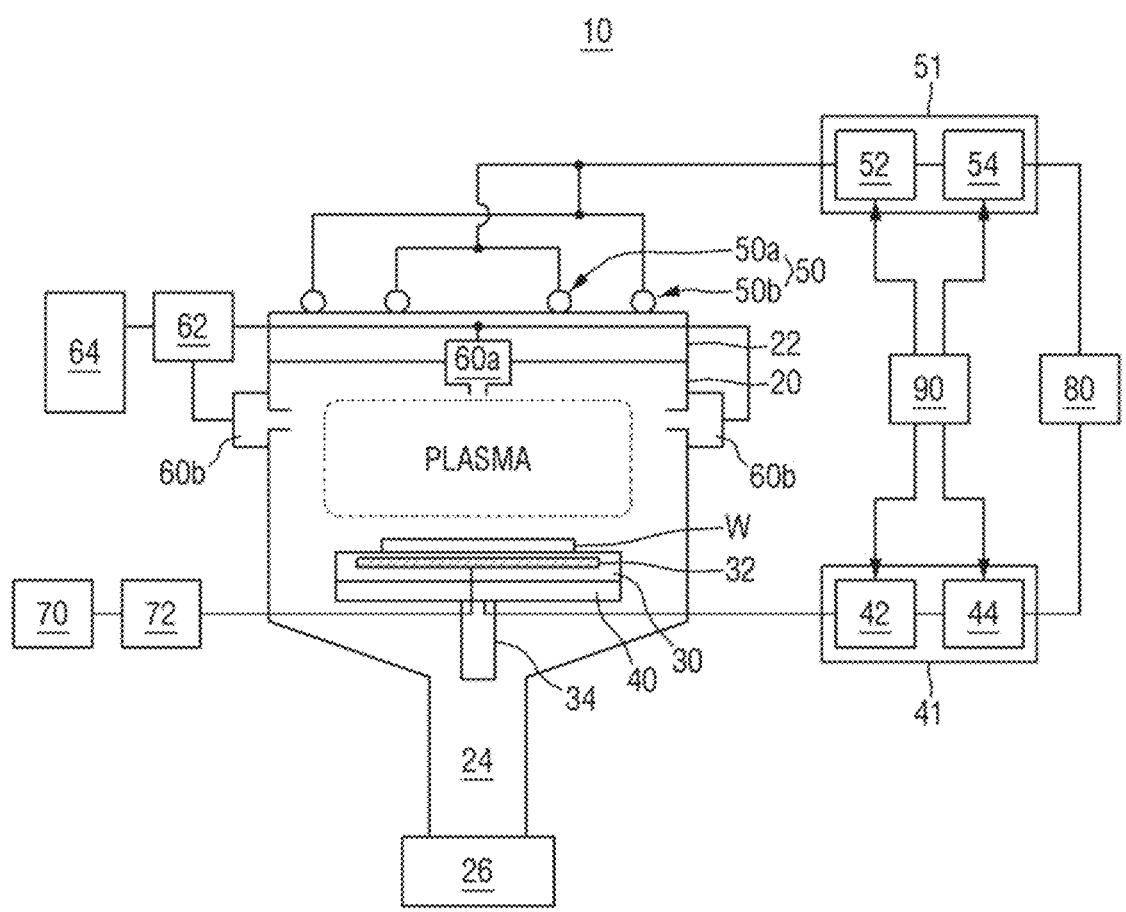
FIG. 14 is a block diagram for illustrating a substrate treatment apparatus according to some example embodiments of the present disclosure.

FIG. 14 is a block diagram for illustrating a substrate treatment apparatus according to some example embodiments of the present disclosure.

Referring to FIG. 14, a substrate treatment apparatus 10 according to some example embodiments of the present disclosure includes the chamber 20, the support member 30 supporting the lower electrode 40 thereon, the upper electrode 50, the source power supply 51, the bias power supply 41 and the controller 80. The substrate treatment apparatus 10 may further include a gas supply and a discharger 26.

In some example embodiments, the substrate treatment apparatus 10 may be configured for etching an etching target film on the substrate W disposed in an inductively coupled plasma (ICP) chamber 20. However, the plasma generated by the substrate treatment apparatus 10 is not limited to the inductively coupled plasma. In another example, a capacitively coupled plasma or a microwave plasma may be generated. Further, the substrate treatment apparatus 10 is not necessarily limited to an etching apparatus, but may be used, for example, as a deposition apparatus, a cleaning apparatus, etc. In this connection, the substrate may include a semiconductor substrate, a glass substrate, etc.

The chamber 20 may provide an enclosed space for performing a plasma etching process of the substrate W. The chamber 20 may be a cylindrical vacuum chamber. The chamber 20 may be made of a metal such as aluminum or stainless steel.

The support member 30 for supporting the substrate W thereon may be disposed inside the chamber 20. The support member 30 may include, but is not limited to, an electrostatic chuck for holding the substrate W thereon using an electrostatic attraction force. The electrostatic chuck may suction and maintain the substrate W using an electrostatic force resulting from DC voltage supplied from a DC power 70.

Further, the support member 30 may receive therein a disk-shaped lower electrode 40 disposed under the electrostatic chuck. The lower electrode 40 may be configured to be movable up and down by a driver 34.

The substrate W is mounted on a top face of the support member 30. A focus ring (not shown) may be mounted to surround the substrate W. The lower electrode 40 may have a larger diameter than that of the substrate W. Further, the lower electrode 40 may have a circulation channel (not shown) for cooling defined therein. Further, for precision control of a wafer temperature, a cooling gas such as He gas may be supplied into a channel between the electrostatic chuck and the substrate W.

A gate (not shown) for entry and exit of the substrate W may be installed in a side wall of the chamber 20. Through the gate, the substrate W may be loaded and unloaded onto and from the support member 30.

The discharger 26 may be connected, via an exhaust pipe, to an exhaust port 24 installed at a bottom of the chamber 20. The discharger 26 may include a vacuum pump such as a turbo molecular pump to adjust a pressure of a treatment space inside the chamber 20 to a pressure of a target vacuum level. Further, process by-products and residual process gases generated in the chamber 20 may be discharged through the exhaust port 24.

The chamber 20 may include a cover 22 that covers an open top thereof. The cover 22 may cover the top of the chamber 20 to seal the chamber. The upper electrode 50 may be disposed out of the chamber 20 so as to face toward the lower electrode 40. The upper electrode 50 may be disposed on a top face of the cover 22. The upper electrode 50 may include a high-frequency RF antenna. The antenna may have a planar coil shape. The cover 22 may include a dielectric window in a shape of a disk. The dielectric window is made of a dielectric material. For example, the dielectric window may include aluminum oxide ($Al_2O_3$). The dielectric window may have an ability to transmit power from the antenna into the chamber 20.

For example, the upper electrode 50 may include an inner coil 50a and an outer coil 50b. The inner coil 50a and the outer coil 50b may have a spiral shape or a concentric circle shape. The inner coil 50a and the outer coil 50b may generate an inductively coupled plasma in a plasma space P of the chamber 20. It will be understood that although two coils are described by way of example, the number, arrangement, etc. of the coils are not limited thereto.

In some example embodiments, the gas supply may include gas supply pipes 60a and 60b, a flow controller 62 and a gas supply source 64 as gas supply elements. The gas supply pipes 60a and 60b may supply various gases to a top and/or a side of the chamber 20. For example, the gas supply pipes may include a vertical gas supply pipe 60a extending through the cover 22 and a horizontal gas supply pipe 60b extending through the side of the chamber 20. The vertical gas supply pipe 60a and the horizontal gas supply pipe 60b may directly supply various gases to the plasma space P in the chamber 20.

The gas supply may supply different gases at a desired ratio. The gas supply source 64 may store a plurality of gases therein, and the gases may be supplied, via a plurality of gas lines respectively connected to the gas supply pipes 60a and 60b, to the chamber. The flow controller 62 may control supply flow rates of the gases to be introduced into the chamber 20 through the gas supply pipes 60a and 60b. The flow controller 62 may individually or collectively control the supply flow rates of the gases to be supplied to the vertical gas supply pipe 60a and the horizontal gas supply pipe 60b, respectively. For example, the gas supply source 64 may include a plurality of gas tanks, and the flow controller 62 may include a plurality of mass flow controllers (MFCs) respectively corresponding to the gas tanks. Each of the mass flow controllers may independently control each of the supply flow rates of the gases.

The gas supply may supply different process gases into the chamber 20. The process gases may include inert gases.

As described above, the source power supply 51 may apply the source power SP having the pulsed high-frequency waveform to the upper electrode 50. The source power supply 51 may apply the source power SP to the upper electrode 50 to generate the plasma in the chamber 20. The bias power supply 41 may apply the bias power BP having the pulsed non-sinusoidal waveform to the lower electrode 40.

The controller 80 is connected to the source power supply 51 and the bias power supply 41 to control operations thereof. The controller 80 may include a microcomputer and various interfaces, and may control an operation of the plasma treatment apparatus according to a program and recipe information stored in an external memory or an internal memory.

The substrate treatment apparatus 10 may include a temperature controller inside the support member. The temperature controller may include a heater and/or a cooler. For example, the temperature controller may include a heater 32 disposed inside the support member 30 for controlling a temperature of the support member 30, a heater power supply 70 for supplying electric power to the heater 32, and a filter 72 disposed between the heater 32 and the heater power supply 70.

Figure 15:
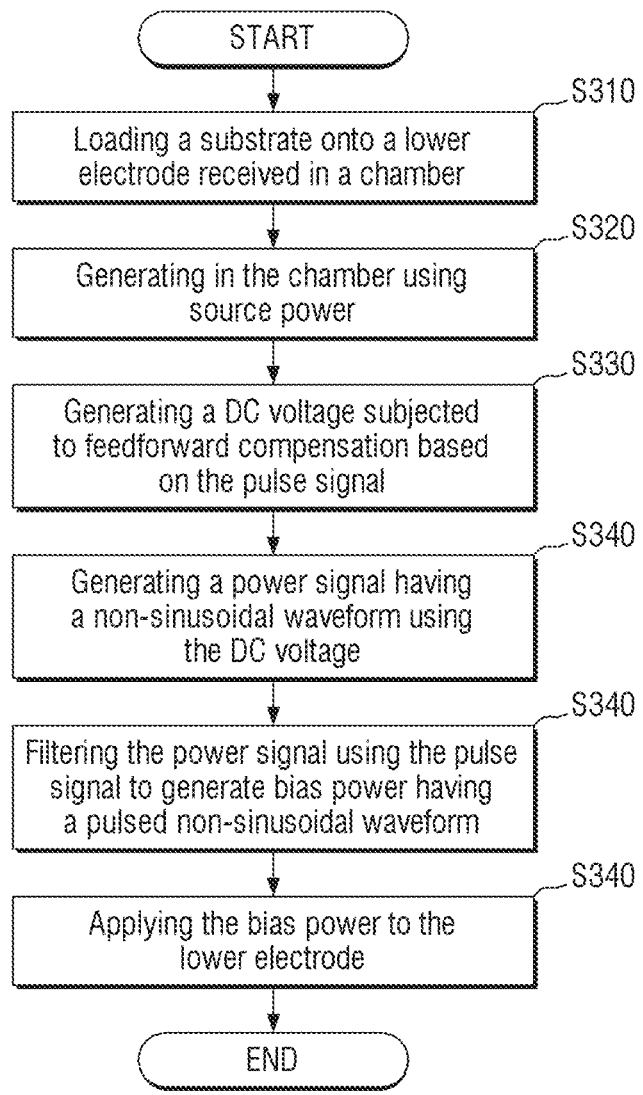
FIG. 15 is a flowchart for illustrating a substrate treatment method according to some example embodiments of the present disclosure.

FIG. 15 is a flowchart for illustrating a substrate treatment method according to some example embodiments of the present disclosure.

Referring to FIG. 8 and FIG. 15, the substrate W is loaded on the lower electrode 40 in the chamber 20 in S310.

Using the source power SP, the plasma is generated in the chamber 20 in S320.

The DC voltage Vout subjected to the feedforward compensation based on the pulse signal PS is generated in S330.

The power signal NS having the non-sinusoidal waveform is generated using the DC voltage Vout in S340.

The method includes filtering the power signal NS using the pulse signal PS to generate the bias power BP having the pulsed non-sinusoidal waveform in S350.

The method includes applying the bias power BP to the lower electrode 40 in S360.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The controller 80 (or other circuitry, for example, the pulse signal generator 90, bias power supply 41, modulator 42, dc power generator 44, MCU 110, feedforward operator 120, DC voltage supply unit 130, feedback operator 150, source power supply 51, subcomponents, or other circuitry discussed herein) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It is apparent to those skilled in the art that although the method has been described based on the substrate treatment apparatus according to some example embodiments of the present disclosure shown in FIG. 8, the method may be applied to the above other example embodiments in substantially the same manner.

Although some example embodiments of the present disclosure have been described above with reference to the accompanying drawings, the present disclosure is not limited to the example embodiments and may be practiced in various different forms. Those of ordinary skill in the technical field to which the present disclosure belongs will be able to understand that the present disclosure may be implemented in other specific forms without changing the technical idea or essential characteristics of the present disclosure. Therefore, it should be understood that the example embodiments as described above are illustrative in all respects and not restrictive.

What is claimed is:

1. An apparatus for treating a substrate, the apparatus comprising:
   a chamber;
   a lower electrode in the chamber, wherein the substrate is configured to be on the lower electrode;
   an upper electrode above the lower electrode;
   a pulse signal generator configured to generate a pulse signal; and
   a bias power supply configured to
     generate bias power having a pulsed non-sinusoidal waveform using the pulse signal, and
     supply the generated bias power to the lower electrode, wherein the bias power supply includes
  a DC power generator configured to
    receive the pulse signal and
    generate a direct-current (DC) voltage subjected to feedforward compensation based on the pulse signal; and
  a modulator configured to
    generate a power signal having a non-sinusoidal waveform using the DC voltage, and
    filter the power signal using the pulse signal to generate the bias power having the pulsed non-sinusoidal waveform.

2. The apparatus of claim 1, wherein
the DC power generator is configured to store a feedforward compensation amount, corresponding to each of a plurality of command voltages, in a lookup table, and
the generating a DC voltage subjected to feedforward compensation is performed based on the feedforward compensation amount in the lookup table.

3. The apparatus of claim 2, wherein
the feedforward compensation amount is a digital value, and
a digital to analog converter is configured to convert the feedforward compensation amount to a feedforward signal as an analog signal.

4. The apparatus of claim 3, wherein the DC power generator includes:
a power switch configured to be turned on and off based on the pulse signal; and
an operational (OP) amplifier configured to multiply a node voltage controlled by the power switch by the feedforward signal to generate a feedforward compensation signal.

5. The apparatus of claim 3, wherein
the DC voltage is configured to be subjected to the feedforward compensation and feedback compensation, and
a feedback compensation amount is determined based on a difference between a feedback signal as the DC voltage as fed back and a command voltage.

6. The apparatus of claim 5, wherein the DC power generator includes:
a power switch configured to be turned on and off based on the pulse signal,
a first operational (OP) amplifier configured to multiply a node voltage controlled by the power switch by the feedforward signal to generate a feedforward compensation signal; and
a second OP amplifier configured to generate a feedback compensation signal based on the difference between the feedback signal and the command voltage.

7. The apparatus of claim 6, wherein the DC power generator further includes a third OP amplifier configured to generate a control signal, based on the feedforward compensation signal and the feedback compensation signal.

8. The apparatus of claim 1, wherein the apparatus further comprises a source power supply configured to
generate a source power having a pulsed high-frequency waveform using the pulse signal, and
supply the source power to the upper electrode or the lower electrode.

9. The apparatus of claim 8, wherein the source power supply includes:
a high-frequency signal generator configured to generate a high-frequency signal, and
filter the high-frequency signal using the pulse signal to generate the source power having the pulsed high-frequency waveform; and
a matcher configured to match an impedance of the source power.

10. The apparatus of claim 9, wherein the matcher is configured to receive the pulse signal, and a position of a capacitance in the matcher is controlled based on the pulse signal.

11. The apparatus of claim 8, wherein the bias power is configured to be shifted relative to the source power.

12. An apparatus for treating a substrate, the apparatus comprising:
a DC voltage supply unit configured to generate a DC voltage, based on a feedforward compensation signal and a feedback compensation signal;
a feedforward operator configured to
  receive a pulse signal and a feedforward signal, and
  generate the feedforward compensation signal based on the pulse signal and the feedforward signal;
a feedback operator configured to receive a feedback signal as the DC voltage as fed back thereto and a command voltage, and to generate the feedback compensation signal based on a difference between the feedback signal and the command voltage; and
a modulator configured to
  generate a power signal having a non-sinusoidal waveform using the DC voltage, and
  filter the power signal using the pulse signal to generate a bias power having a pulsed non-sinusoidal waveform.

13. The apparatus of claim 12, wherein
the apparatus is configured to store a feedforward compensation amount, corresponding to each of a plurality of command voltages, in a lookup table,
the feedforward compensation amount is a digital value, and
a digital to analog converter is configured to convert the feedforward compensation amount to the feedforward signal as an analog signal.

14. The apparatus of claim 13, wherein the feedforward operator and the feedback operator are analog circuits.

15. The apparatus of claim 12, wherein the feedforward operator includes:
a power switch configured to be turned on and off based on the pulse signal;
a first OP amplifier configured to multiply a node voltage controlled by the power switch by the feedforward signal to generate the feedforward compensation signal; and
a second OP amplifier configured to generate the feedback compensation signal based on a difference between the feedback signal and the command voltage.

16. The apparatus of claim 15, wherein the DC voltage supply unit includes:
a third OP amplifier configured to generate a first control signal based on the feedforward compensation signal and the feedback compensation signal;
a DC power control integrated circuit (IC) configured to generate a second control signal whose a duty ratio is controlled based on the first control signal; and
a DC power main circuit configured to generate the DC voltage based on the second control signal.

17. An apparatus for treating a substrate, the apparatus comprising:
a chamber;

a lower electrode in the chamber, wherein the substrate is seated on the lower electrode;

an upper electrode above the lower electrode;

a pulse signal generator configured to generate a pulse signal;

a bias power supply configured to
- generate bias power having a pulsed non-sinusoidal waveform using the pulse signal, and
- supply the generated bias power to the lower electrode; and a source power supply configured to generate source power having a pulsed high-frequency waveform using the pulse signal and supply the source power to the upper electrode, wherein the bias power supply includes
- a power switch configured to be turned on and off based on a pulse signal;
- a first operational (OP) amplifier configured to multiply a node voltage controlled by the power switch by a feedforward signal to generate a feedforward compensation signal;
- a second OP amplifier configured to generate a feedback compensation signal based on a difference between a feedback signal as a DC voltage fed back thereto and a command voltage;
- a third OP amplifier configured to generate a first control signal based on the feedforward compensation signal and the feedback compensation signal;
- a DC power control integrated circuit (IC) configured to generate a second control signal whose a duty ratio is controlled based on the first control signal; and
- a DC power main circuit configured to generate the DC voltage based on the second control signal.

* * * * *